United States Patent
Wanlass

[19]

[11] Patent Number: 6,015,727
[45] Date of Patent: Jan. 18, 2000

[54] DAMASCENE FORMATION OF BORDERLESS CONTACT MOS TRANSISTORS

[76] Inventor: Frank M. Wanlass, 2655 Keystone Ave., Apt. 4, Santa Clara, Calif. 95051

[21] Appl. No.: 09/093,221

[22] Filed: Jun. 8, 1998

[51] Int. Cl.[7] .................................................. H01L 21/8238
[52] U.S. Cl. ........................ 438/218; 438/221; 438/299; 438/303; 438/585
[58] Field of Search ..................................... 438/275, 300, 438/528, 595, 585, 301, 303, 218, 221, 229, 294

[56] References Cited

U.S. PATENT DOCUMENTS

| | | |
|---|---|---|
| 5,028,555 | 7/1991 | Haskell . |
| 5,721,173 | 2/1998 | Yano et al. . |
| 5,770,485 | 6/1998 | Gardner et al. . |
| 5,780,325 | 7/1998 | Lee . |
| 5,851,883 | 12/1998 | Gardner et al. . |
| 5,904,529 | 5/1999 | Gardner et al. . |

*Primary Examiner*—John F. Niebling
*Assistant Examiner*—Jonathan Hack

[57] ABSTRACT

This invention is a processing method for forming MOS transistors. The method uses chemical mechanical polishing to self align an MOS transistor gate electrode to the channel region in both the width and length directions. The method enables metal interconnect lines to make borderless connections to MOS gate electrodes directly over channel regions, and allows borderless connections to be made to source and drain regions, thereby improving layout density of small transistors. The method enables interconnect lines to be patterned on a planar surface, which facilitates the etching of very narrow and closely spaced lines. The method does not require any Shallow Trench Isolation (STI), and does not require Local Oxidation of Silicon (LOCOS), thereby resulting in little damage to the silicon. The method also prevents plasma damage of very thin gate dielectrics during processing.

20 Claims, 7 Drawing Sheets

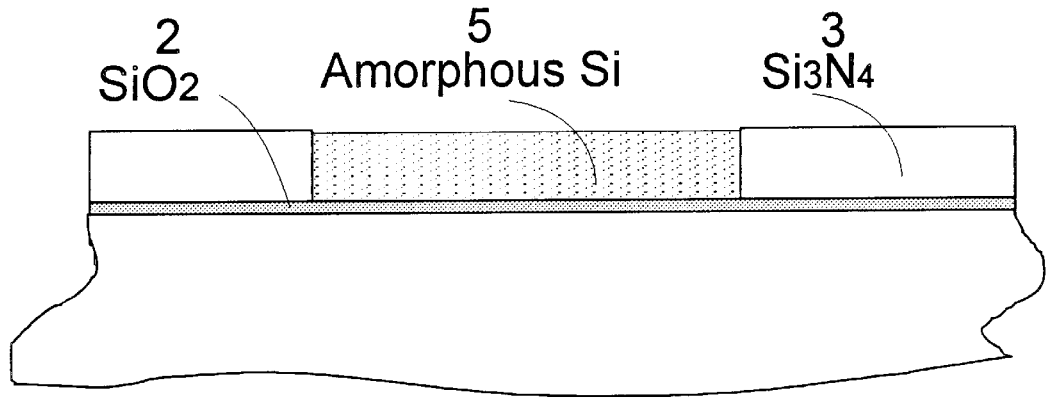
FIG. 2A
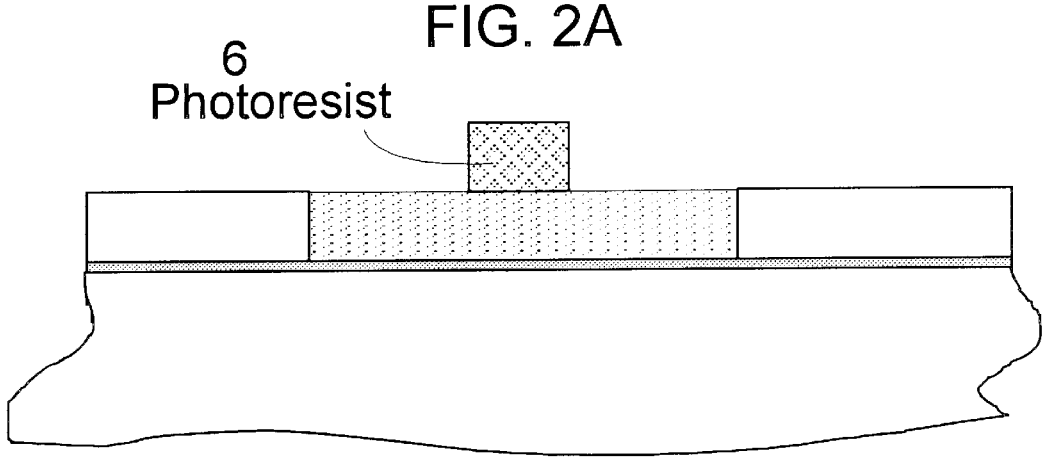
FIG. 2B  Side View
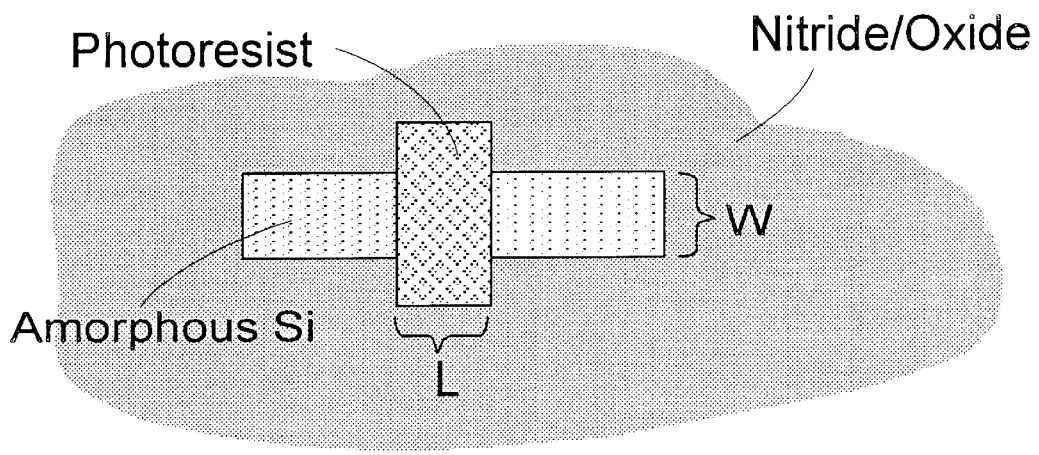
FIG. 2C  Top View

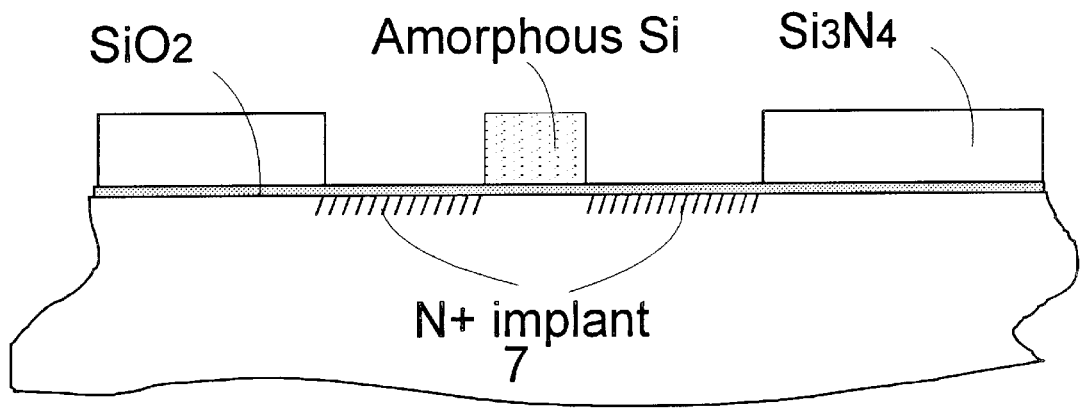
FIG. 3A
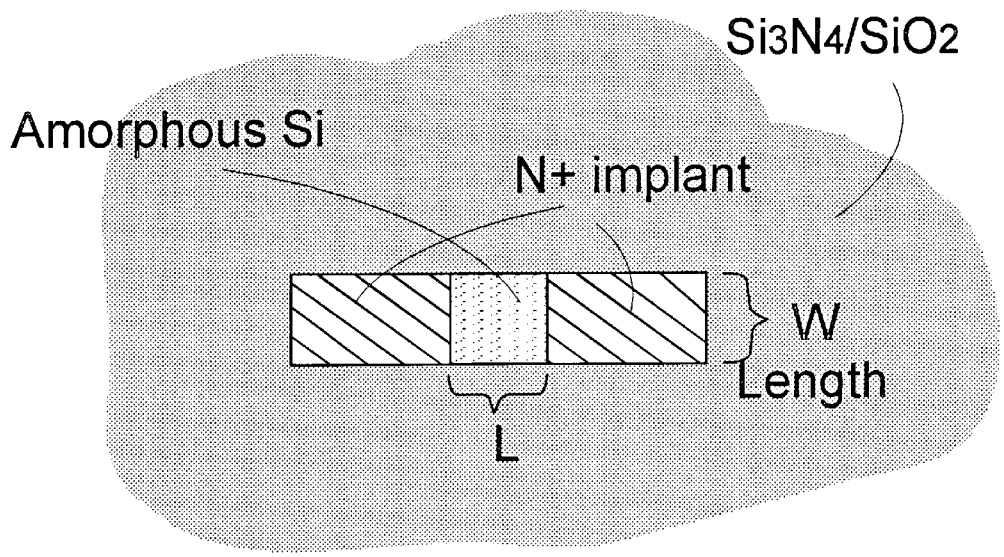
FIG. 3B  Top View

DAMASCENE FORMATION OF BORDERLESS CONTACT MOS TRANSISTORS

FIELD OF THE INVENTION

This invention is a processing method for forming an MOS transistor where the gate electrode is self aligned to the channel region in both the width and length directions, and where a metal interconnect line makes borderless connection to the gate electrode, and where metal interconnect lines make borderless connections to the source and drain diffusions. The method does not require any defect generating heavy oxidation of the silicon.

BACKGROUND OF THE INVENTION

MOS silicon gate technology defines an MOS transistor location by a field oxide opening, and defines the MOS channel region location by a polysilicon gate electrode overlying this opening. The width of the polysilicon (poly) determines the channel length L, and the width of the field oxide opening determines the channel width W. The poly is made longer than the channel width to allow for misalignment tolerance. For a very narrow sub micron channel width this tolerance can be almost as large as the width. Furthermore, if a metal connection is to be made to the poly, the poly has to extend even further beyond the channel width to make room for a contact hole to the metal. These considerations can severely limit the circuit layout density of very small transistors.

SUMMARY OF THE INVENTION

The present invention is a method for forming MOS transistors where the gate electrodes are self aligned to the transistor channel regions in both the width and the length directions, and where interconnect metal makes borderless contact to the gate electrodes directly above channel regions, and where interconnect metal makes borderless contact to diffused source and drain regions In addition, this invention:

1- Allows the use of gate electrodes made from metal or other conductors.
2- Provides totally planar surfaces for all masking levels; this facilitates photo masking of very narrow and closely spaced features.
3- Prevents plasma damage of gate dielectrics during processing.
4- Minimizes substrate defects by not using Local Oxidation of Silicon (LOCOS), or Shallow Trench Isolation (STI).

BRIEF DESCRIPTION OF THE DRAWINGS

FIG. 2 shows the wafer after chemical mechanical polishing of the amorphous silicon, and after applying and patterning photoresist.

FIG. 3 shows the wafer after heavy N+ implantation.

DETAILED DESCRIPTION OF THE INVENTION

Figure 1A:
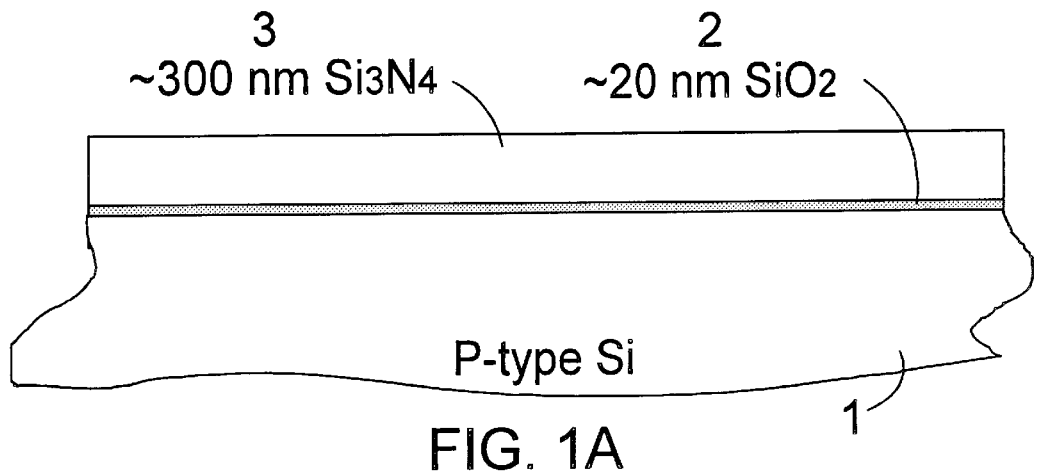
FIG. 1 is a cross section of a portion of a P type wafer coated with a thin silicon dioxide (oxide) pad layer and a thick silicon nitride (nitride) layer, where the nitride layer then has an opening etched to the oxide, and then a layer of amorphous silicon is deposited.

The following is a description of a preferred process flow for forming NMOS transistors; the steps for forming PMOS transistors are not described, but will be the same except for the use of a P+ instead of an N+ implant:

1. FIG. 1A shows, at the start of the process, a portion of a P type silicon wafer 1 coated first with a thin layer 2 of silicon dioxide (oxide) ~20 nm thick, and then coated with a layer 3 of silicon nitride (nitride) ~300 nm thick.

Figure 1B:
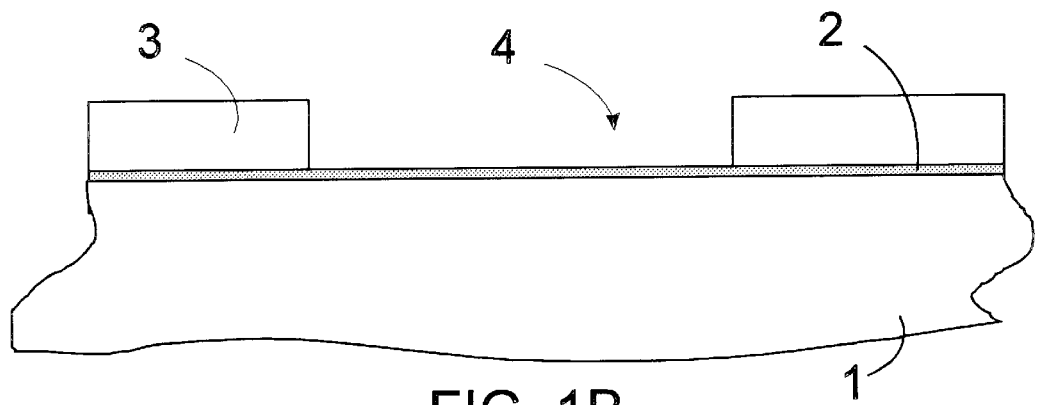

2. Photoresist is patterned and nitride layer 3 is anisotropically plasma etched, stopping at the thin oxide layer 2, and resulting in an opening 4, as shown in FIG. 1B after photoresist removal. This plasma could be formed in a $Cl_2/O_2$ gas mixture as disclosed in U.S. Pat. No. 4,832,787 to J. A. Bondur. The opening 4 will determine the position of a subsequent NMOS transistor, and is representative of many such openings in an integrated circuit.

Figure 1C:
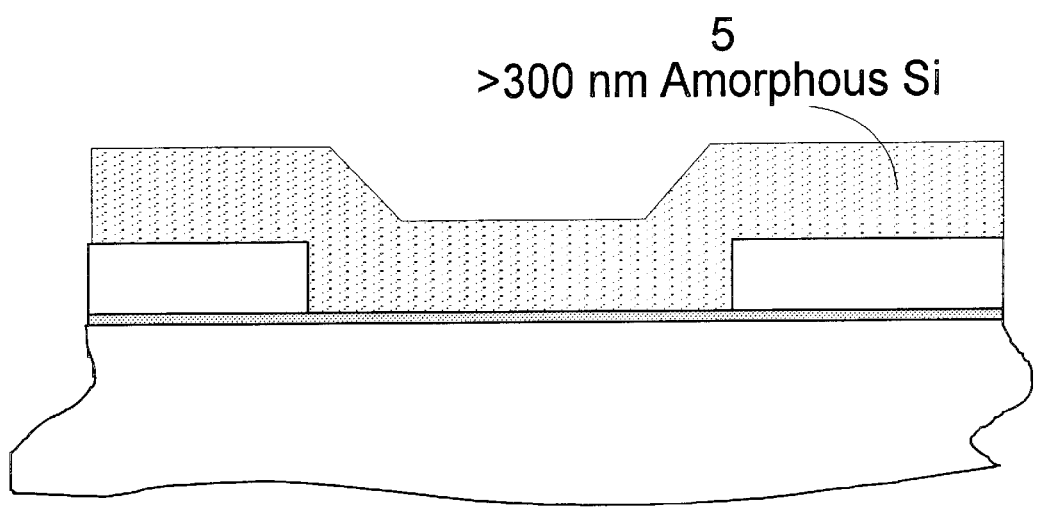

3. Amorphous silicon 5 is deposited to a thickness greater than the thickness of layer 3, as shown in FIG. 1C.

4. Chemical mechanical polishing is performed on the amorphous silicon using layer 3 as a polish stop, resulting in the top surface of the amorphous silicon left in opening 4 being coplanar with the top surface of layer 3, as shown in FIG. 2A. This polishing could be accomplished with a polishing pad using a slurry containing KOH and very small silica or alumina particles.

5. Photoresist 6 is applied and patterned to define the transistor channel region, with the width of the photoresist defining the subsequent NMOS channel length L, and the width of the amorphous silicon in opening 4 defining the channel width W, as shown in FIGS. 2B and 2C.

6. With the photoresist in place, the amorphous silicon is anisotropically plasma etched, stopping at the underlying thin oxide 2. This should be a bromine or chlorine based plasma that etches nitride or oxide much more slowly than silicon. With the resist still in place a high dose N+ implant 7, of phosphorus or arsenic, is performed with the photoresist and amorphous silicon protecting the portion of underlying silicon that will be a subsequent channel region. The implant energy should be very low because only the thin oxide 2 has to be penetrated. FIG. 3 shows the results of this after photoresist removal.

Figure 4A:
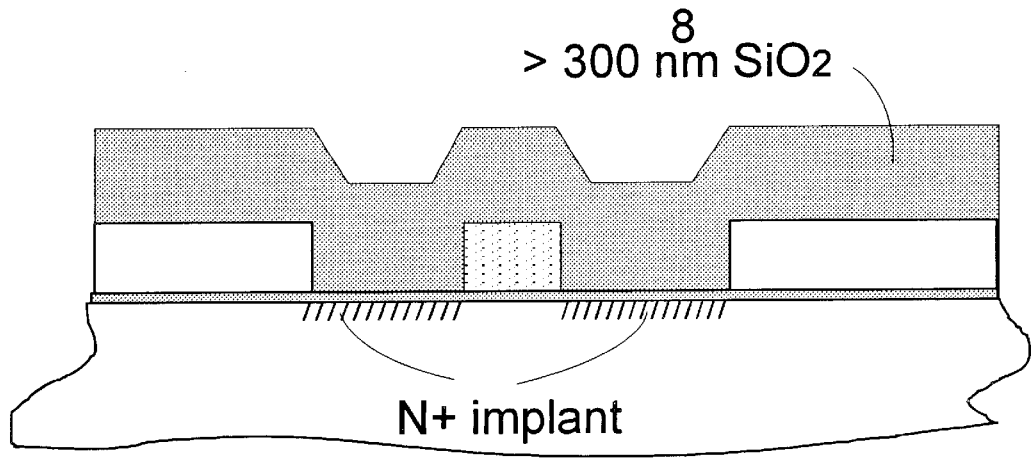
FIG. 4 shows the wafer after depositing thick oxide, after chemical mechanical polishing of the oxide, and after removing amorphous silicon.
Figure 4B:
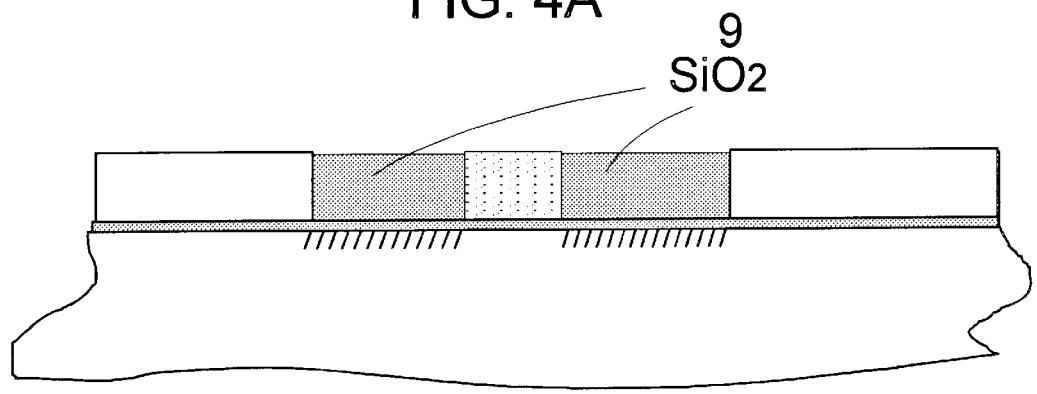
Figure 4C:
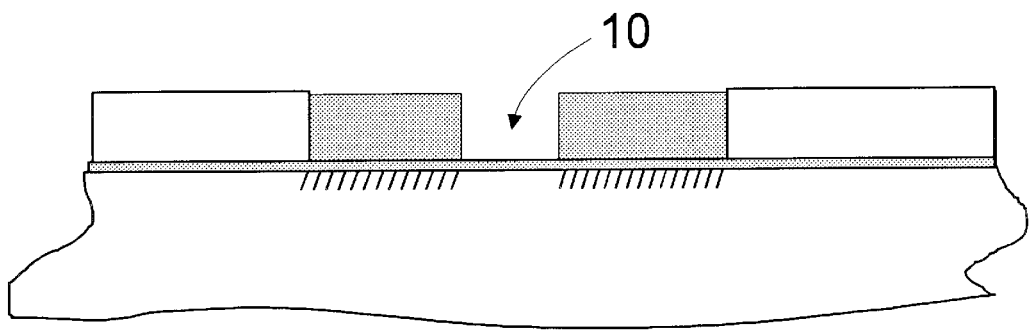

7. Oxide 8 is deposited to a thickness greater than nitride layer 3 thickness, as shown in FIG. 4A. This oxide could deposited from tetraethylorthosilicate gas in a mixture with ozone at a temperature of approximately 400° C. Chemical mechanical polishing is performed on oxide 8, using layer 3 as a polish stop, and leaving oxide regions 9 overlying the implanted dopant 7, as shown in FIG. 4B. Again this polishing could be accomplished with a polishing pad using a slurry containing KOH and very small alumina or silica particles. The remaining amorphous silicon is removed using a chemical or a plasma etch, where this etch does not significantly etch oxide or nitride, resulting in opening 10, as shown in FIG. 4C. If there is a small amount of oxide left over the amorphous silicon after oxide polishing, it might be necessary to do a very short oxide etch first.

8. Optionally, a light dose of boron is implanted for punch through control and field inversion control. If the energy of the implant centers the boron at the ~300 nm nitride/oxide to underlying silicon interface, the field inversion voltage will be raised, and at the same time the implanted boron will be ~300 nm below the surface in the channel area, which will raise the source to drain punch through voltage. If desired, multiple boron implants at different energies can be performed at this time.

Figure 5A:
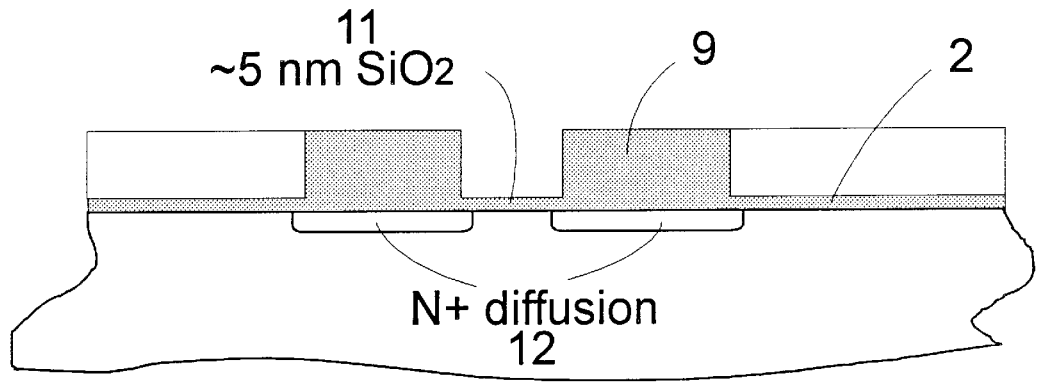
FIG. 5 shows the wafer after regrowing a thin gate oxide, after diffusing the N+, after depositing titanium nitride (TiN), and after etching contact openings.
Figure 5B:
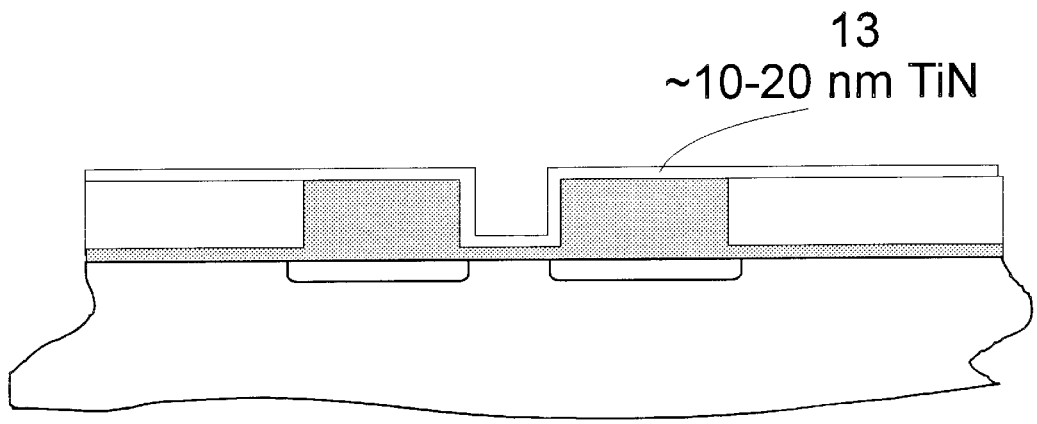
Figure 5C:
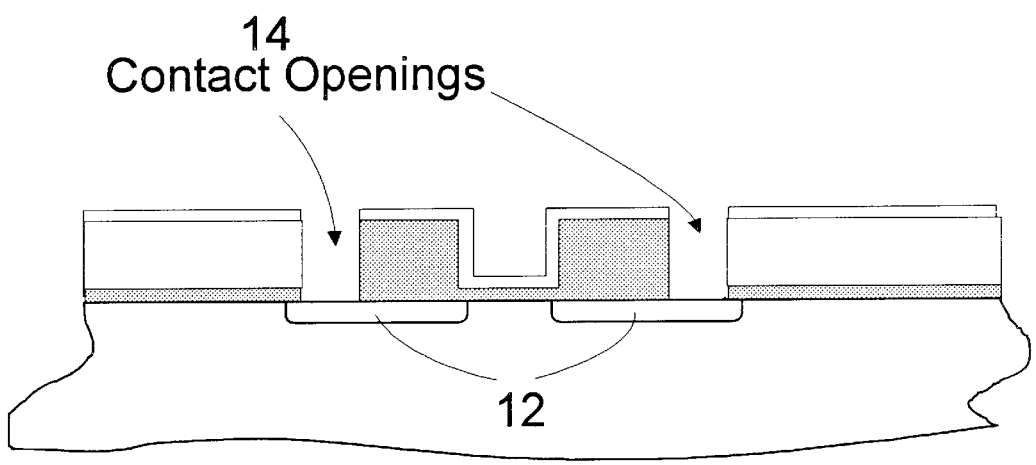

9. The thin oxide at the bottom of opening 10 is removed using a selective oxide etch, a new fresh gate oxide 11 is grown ~5 nm thick, and the N+ implants are annealed and slightly diffused to form N+ diffusion regions 12, as shown in FIG. 5A. A thin layer 13 of titanium nitride (TiN) is deposited (~10–20 nm), as shown in FIG. 5B. Contact openings 14 are masked and etched through the TiN and anisotropically plasma etched through the ~300 nm field oxide to the N+ diffusions, using a fluorine based plasma etch chemistry that etches oxide, and does not significantly etch nitride. Even if this contact etch is misaligned and is over a junction edge the junction will not be exposed, because the junction edges are diffused slightly sideways, beneath the nitride layer 3, as shown in FIG. 5C.

Figure 6A:
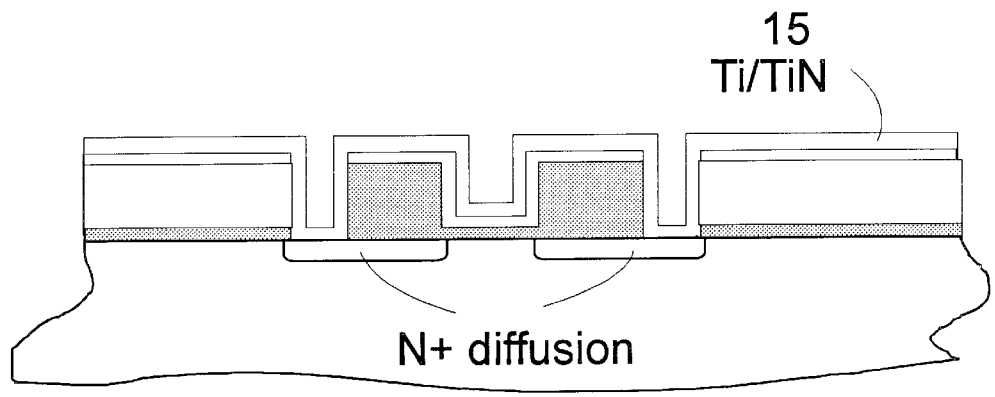
FIG. 6 shows the wafer after depositing titanium/titanium nitride (Ti/TiN), after depositing tungsten, and after chemical mechanical polishing of the tungsten.
Figure 6B:
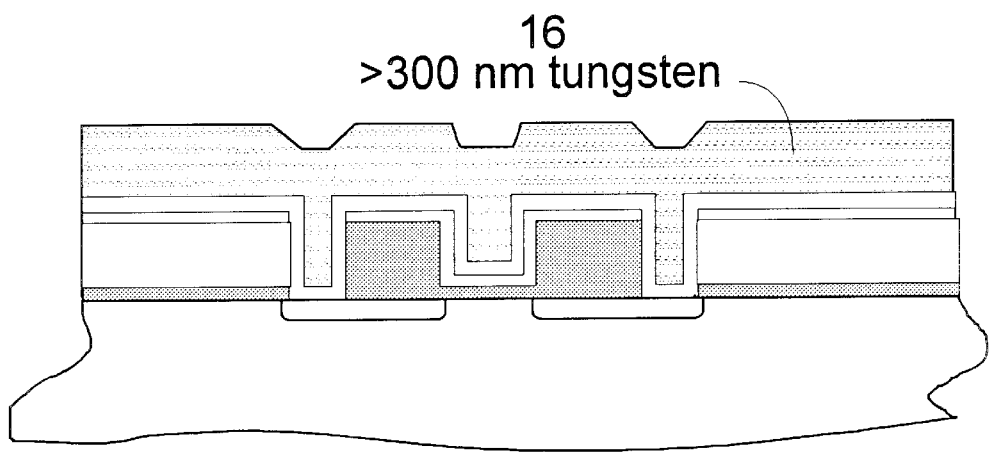
Figure 6C:
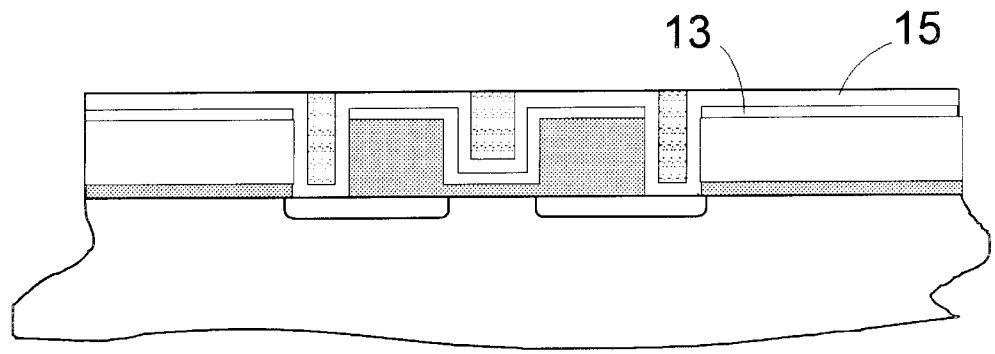

10. A thin double layer 15 of first titanium (Ti) and then TiN is deposited. The Ti assures an ohmic contact to the N+ diffusions. A layer of tungsten 16 is deposited to a thickness greater than 300 nm. The tungsten is chemically mechanically polished using layer 15 as a polish stop, ending with a flat surface. This etch could be performed as described in U.S. Pat. No. 5,516,346 to K. C. Cadien. All of this is shown in FIG. 6.

Figure 7A:
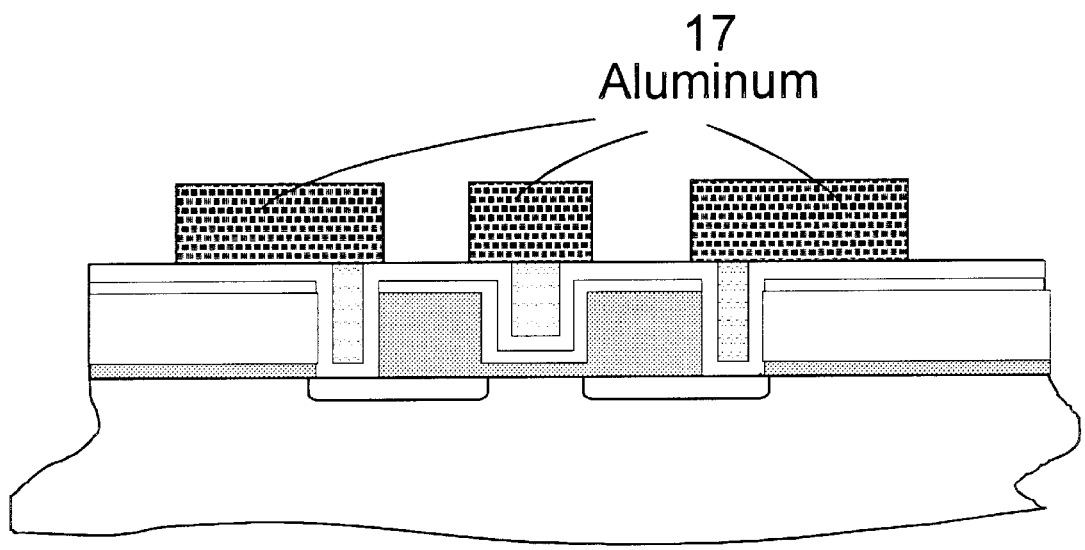
FIG. 7 shows the wafer after depositing and patterning aluminum, and after selectively removing Ti and Ti/TiN.
Figure 7B:
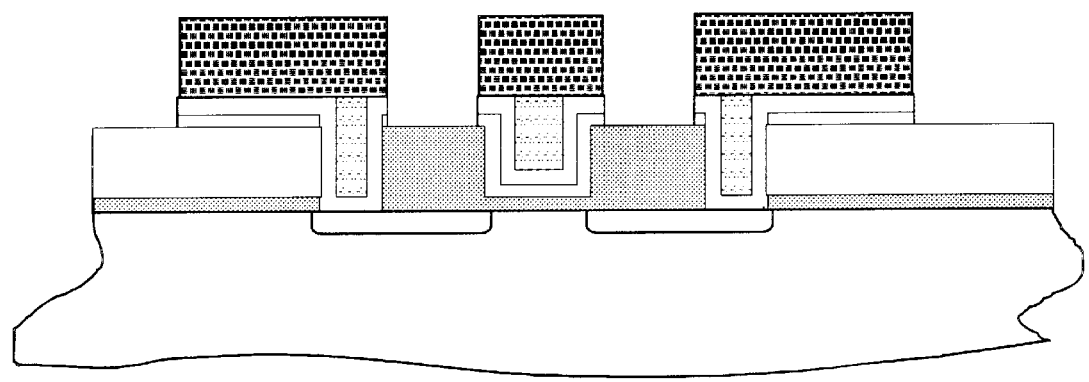

11. Aluminum 17 is deposited, photo masked, and patterned to form interconnects. With the photoresist still in place, the underlying thin layers of TiN, Ti, TiN are etched. FIG. 7 shows this after photoresist removal. Because the thin underlying TiN/Ti/TiN layer is not removed until after the aluminum is patterned, there are never any floating gates during processing that might be plasma damaged.

I claim:

1. A method of making a semiconductor device comprising:
    providing a substrate;
    forming a first dielectric layer over said substrate;
    etching one or more openings in said first dielectric layer, wherein said openings define the location of MOS transistors;
    depositing a material layer over said substrate to fill said openings;
    pattering said material layer to define source and drain regions adjacent to a remaining portion of said material layer;
    doping said source and drain regions with dopants;
    depositing a second dielectric layer over said source and drain regions;
    removing said remaining portion of said material layer to define a channel region in said substrate said channel region disposed between said source and drain regions;
    depositing a third dielectric layer over said channel region to form a gate insulating layer;
    etching contact openings over said source and drain regions;
    forming contacts over said gate insulating layer and in said contact openings.

2. The method of claim 1, wherein said first dielectric layer includes an etch stop layer; and
    wherein said material layer is pattered by anisotropic etching stopping before etching through said etch stop layer.

3. The method of claim 1, wherein said step of depositing said material layer further includes polishing said material layer so that said material layer remains in only said openings and wherein said material layer is substantially coplanar with said first dielectric layer.

4. The method of claim 1, wherein said first dielectric layer has a characteristic etch rate different than that of said material layer and different than that of said second dielectric layer.

5. The method of claim 1, wherein said second dielectric layer over said source and drain region is polished to be substantially coplanar with said first dielectric layer.

6. The method of claims 3 and 5, wherein said polishing is chemical mechanical polishing.

7. The method of claim 1, wherein forming said contacts further includes the steps of:
    depositing a conductive layer over said substrate before the step of etching contact openings over said source and drain regions;
    depositing a conducting material over said conductive layer and in said contact openings wherein said conducting material forms electrical contact with said substrate and wherein said conducting material acts as a barrier layer;
    depositing an electrical contact material over said substrate and filling said contact openings; and
    patterning and isolating a conductor over said electrical conduct material to make electrical contact with said source and drain regions and said conducting material over said channel region.

8. The method of claim 1, further includes doping said channel region to control punch through, threshold voltage and field inversion.

9. The method of claim 1, wherein the step of doping said source and drain region includes controlling junction profiles to minimize hot carrier effects.

10. The method of claim 2, wherein said first dielectric material is a silicon nitride, and wherein said etch stop layer is a silicon oxide, and wherein said second dielectric material is a silicon oxide and wherein said gate insulating layer is a silicon oxide.

11. The method of claim 7, wherein said conducting layer is TiN, and wherein said conducting material is a multilayer comprising a first layer of Ti and a second layer of TiN, and wherein said contact material is tungsten, and wherein said conductor is aluminum.

12. The method of claim 1, wherein said material layer is selected from the group consisting of amorphous silicon or polysilicon.

13. A method for making a semiconductor device comprising:
    providing a substrate;
    forming a first dielectric layer over said substrate;
    forming a second dielectric layer over said substrate;
    etching one or more openings in said second dielectric layer wherein said openings define the location of MOS transistors;
    depositing a material layer over said substrate to fill said openings;
    removing said material layer except in said openings,
    patterning said material layer to define source and drain regions;
    implanting dopants through said first dielectric layer into said substrate to form source and drain regions;
    depositing a third dielectric layer in said openings, said third dielectric layer disposed above said source and drain regions;

removing said pattered material layer;

removing said first dielectric layer from a region disposed between said source and drain regions to define a channel region in said substrate;

depositing a fourth dielectric layer over said channel region to form a gate insulting layer;

activating and diffusing said dopants;

depositing a first layer of TiN over said substrate;

etching contact openings over said source and drain regions;

depositing a layer of Ti over said substrate;

depositing a second layer of TiN over said substrate;

depositing a layer of tungsten over said contact openings and over said channel region; and patterning and isolating a conductive material over said insulating layer and said source and drain regions.

14. The method of claim 13, wherein said first dielectric layer is a silicon oxide layer which acts as an etch stop during the step of patterning said material layer to define said source and drain regions so that said first dielectric layer remains over said source and drain regions.

15. The method of claim 13, wherein said step of depositing said material layer further includes polishing said material layer so that said material layer only remains in said openings and wherein said material layer is substantially coplanar with said second dielectric layer.

16. The method of claim 13, wherein said third dielectric layer over said source and drain region is polished to be substantially coplanar with said second dielectric layer.

17. The method of claims 15 and 16, wherein said polishing is chemical mechanical polishing.

18. The method of claim 13, further includes doping said channel region to control punch through, threshold voltage and field inversion.

19. The method of claim 13, wherein the step of doping said source and drain region includes controlling junction profiles to minimize hot carrier effects.

20. The method of claim 13, wherein said material layer is selected from the group consisting of amorphous silicon or polysilicon.

\* \* \* \* \*